United States Patent [19]
Bezner

[11] Patent Number: 4,855,190
[45] Date of Patent: Aug. 8, 1989

[54] ELECTROLUMINESCENT LIGHTING ELEMENTS

[75] Inventor: Baruch Bezner, Tel-Aviv, Israel

[73] Assignee: Technoset Ltd., Ramat Gan, Israel

[21] Appl. No.: 127,640

[22] Filed: Dec. 2, 1987

[30] Foreign Application Priority Data

Dec. 3, 1986 [IL] Israel .................................. 80861

[51] Int. Cl.$^4$ .......................... B44D 1/18; B05D 5/06; B05D 5/12
[52] U.S. Cl. .................................... 428/690; 313/503; 313/512
[58] Field of Search .................. 428/690, 691, 917; 313/503, 505, 512

[56] References Cited

U.S. PATENT DOCUMENTS 4,661,373  4/1987  Kato et al. ................. 428/690 X
4,708,914  11/1987  Kamijo ...................... 428/690

Primary Examiner—Nancy A. B. Swisher
Attorney, Agent, or Firm—Michael N. Meller

[57] ABSTRACT

A continuous, foil-like electroluminescent lighting element having a plurality of separate units, each unit constituted of one or more discrete pieces of a phosphor, and being fully encapsulated in a cell consisting of a dielectric, which cell is at least partly embedded in a sealing substance. The element also comprises two electrodes, of which at least one is at least partly light-transmissive and between which electrodes are disposed the dielectric cells containing the encapsulated phosphor units, and the sealing substance. Each of the phosphor-containing cells is thereby substantially isolated from adjacent cells.

12 Claims, 6 Drawing Sheets

ELECTROLUMINESCENT LIGHTING ELEMENTS

The present invention relates to continuous, foil-like electroluminescent lighting elements.

Many phosphors emit light when acted upon by an electric field, an effect know as electroluminescence (EL). The EL light is emitted as a result of interaction between the substance and the electric field, and not due to secondary effects such as chemical changes or ultraviolet light.

Depending on the type of external voltage acting upon the phosphor (AC or DC), the effect is due to two different physical phenomena. With AC, the phosphor is insulated from the external electrodes by dielectric layers, resulting in an internal luminescence caused by capacitive coupling between the substance and the external electric field.

With DC, on the other hand, luminescence is generated in the phosphor due to the injection of free charges as a result of passing the DC current through the phosphor.

With each of these modes—AC and DC—there can be two types of devices: thin-layer and thick-layer devices. Thin-layer devices are produced by such processes as evaporation, sputtering or chemical vapor deposition (CVD). Because of the brittleness of these thin layers, they are applied to glass substrates. Prior art thin-layer EL-devices are therefore non-flexible.

In thin-layer devices, the most commonly used phosphor is ZnS as host and Mn (in concentrations of less than 1%) as activator. While this substance has been found most efficient, and EL-devices using it have the longest service life, other phosphors, too, are in use, mainly in order to obtain light of different colors.

Thick-layer devices, on the other hand, are based on pulverulent phosphors in a polymer or low-melting-point glass matrix. While much cheaper to produce than thin-film devices, they have a much lower conversion efficiency than the thin-film devices (about 1 Lm/W as against about 7 Lm/W); their luminance is much lower (10–30 foot-lambert as against several thousand foot-lambert) and their service life is much shorter (1000–3000 hours as against $10^4$ hours), and is also greatly affected by higher temperatures.

Both devices, however, suffer from a decisive disadvantage: they are exceedingly sensitive to environmental conditions, especially to moisture. Due to the strong electric field between the electrodes, water molecules present will undergo electrolysis and, subsequently, the oxygen and hydrogen thus produced will cause decomposition of the ZnS and substantially accelerate degradation and falling-off in EL-performance.

Water molecules can reach the phosphor in two ways: (a) during a faulty manufacturing stage, when water vapor is permitted to infiltrate the phosphor layer and (b) due to faulty or damaged sealing of the device, which will expose it to ambient conditions.

It is the cruciality of perfect sealing that constitutes the most serious obstacle to a wider application of EL-lighting devices, as it is because of this that these devices can be made in fixed, predetermined sizes and shapes only and, once prepared, cannot be further cut, punched, drilled, riveted or otherwise machined, as all such operations would not only destroy the sealing locally, but would initiate a progressive, self-propagating deterioration and indeed decomposition, of the entire device.

It is one of the objects of the present invention to overcome the drawbacks and disadvantages of the prior art, and to provide EL-lighting devices that can be produced as foil-like webs of unlimited length and of a width determined only by the production facilities available, from which webs EL- surfaces of any size and shape can be cut and, subsequenty, drilled, punched, or riveted for mounting with only the freshly produced edges being adversely affected by moisture, but with the limited local damage effectively prevented from propagating itself, and that can be flexed, folded and twisted to assume any shape.

This the invention achieves by providing a continuous, foil-like electroluminescent lighting element comprising:

a plurality of separate units, each constituted of one or more discrete pieces of a phosphor, each unit being fully encapsulated in a cell consisting of a dielectric, which cell is at least partly embedded in a sealing substance, and two electrodes of which at least one is at least partly light-transmissive, between which electrodes are disposed said dielectric cells containing said encapsulated phosphor units, and said sealing substance, wherein each of said phosphor-containing cells is substantially isolated from adjacent cells.

The invention will now be described in connection with certain preferred embodiments with reference to the following illustrative figures so that it may be more fully understood.

With specific reference now to the figures in detail, it is stressed that the particulars shown are by way of example and for purposes of illustrative discussion of the preferred embodiments of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Figure 1:
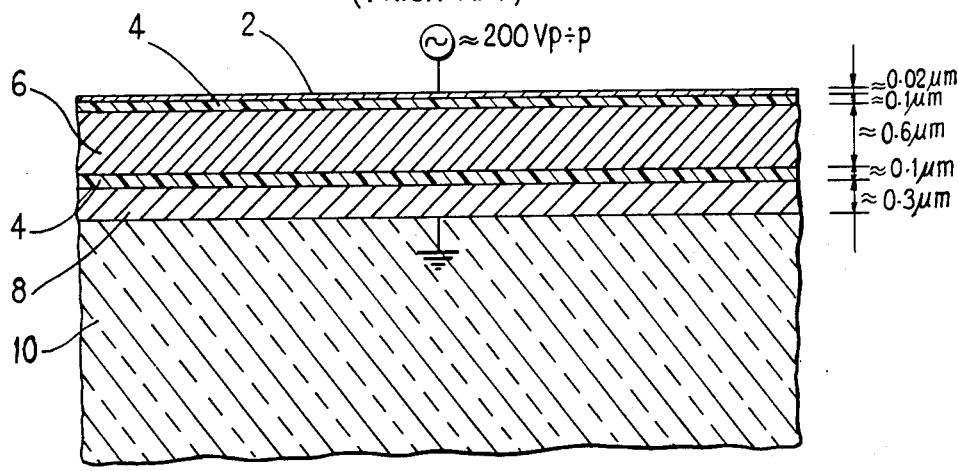
FIG. 1 is a schematic, cross-sectional view of a prior-art thin-layer EL-element.

Referring now to the drawings, there is shown in FIG. 1 a schematic cross-section of a prior-art thin-layer EL-element seen to comprise, from top to bottom, an aluminum layer 2, serving as a first electrode, a first dielectric layer 4, the phosphor layer 6 consisting of ZnS as host and Mn as activator, a second dielectric layer 4, a second, transparent, electrode 8 usually made of ITO (indium-tin oxide), and rigid glass substrate 10.

It is seen that the phosphor layer 6 is continuous. Consequently, as already mentioned, when the element is cut, or even when the edge sealing (not shown) is damaged, there is nothing to prevent water molecules to "work" themselves through, and cause irreparable damage to, the entire element. The rigid substrate 10 is required to prevent bending stresses in the very thin (approximately 0.6 μm) phosphor layer. Such stresses are liable to produce microcracks, resulting in breakdowns or arcing between the dielectric layers 4, as the field strength is very high (up to 2 MV cm$^{-1}$). Elements of this type can therefore be used only for plane lighting devices.

The dimensional indications on the right of this and the following figures should be understood as orders of magnitude given by way of example only, mainly to illustrate the relative thickness of the various layers.

Figure 2:
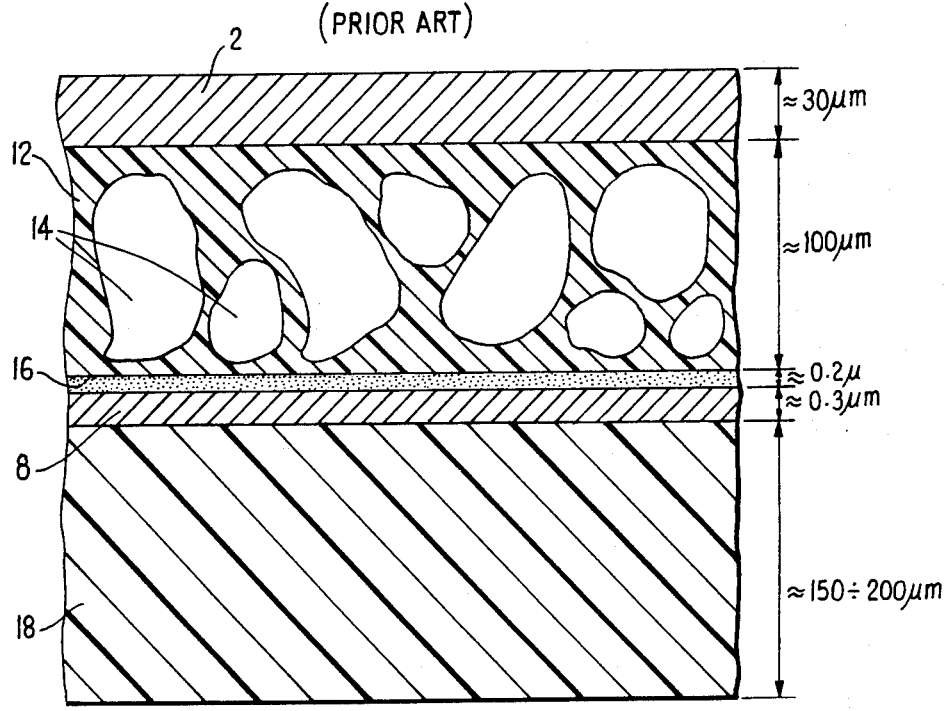
FIG. 2 is a similar view of a prior-art thick-layer element.

FIG. 2 represents a schematic cross-section of a prior-art thick-layer EL-element. There is seen, again from top to bottom, an aluminum layer 2 serving as first electrode, a dielectric binder 12 surrounding grains 14 of the phosphor (ZnS:CuS), a binder 16, the second, transparent, electrode 8 (ITO) and a plastic substrate 18. The prior-art elements are completely sealed-in by low-water-permeability films not shown.

The problems seriously limiting the applicability of these prior-art devices have been discussed earlier.

Figure 3:
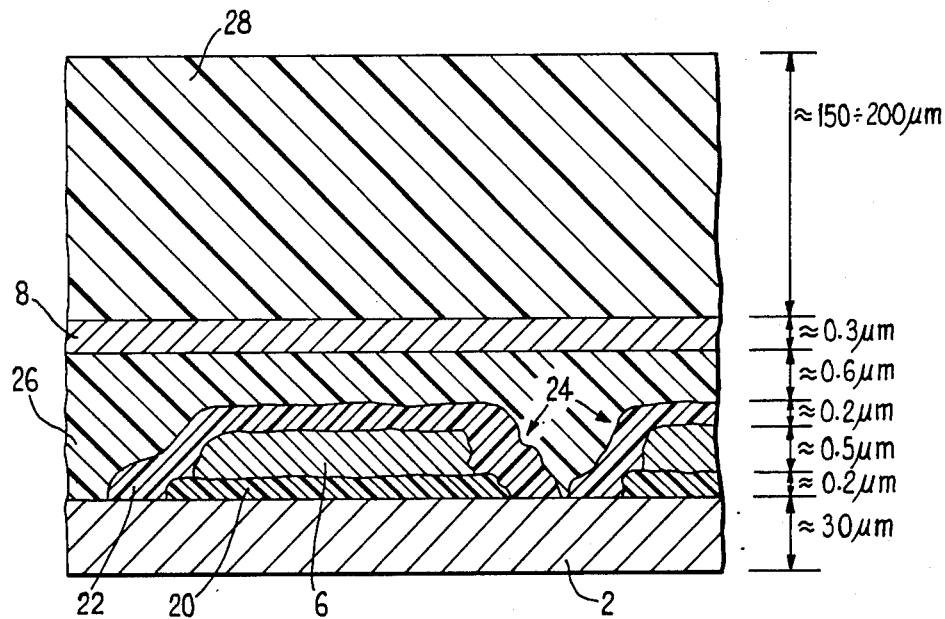
FIG. 3 represents a schematic, cross-sectional view of a thin-layer EL-element according to the invention.

FIG. 3 represent a thin-layer EL-element according to the invention.

There is seen a flexible aluminum foil 2 that serves as a support, on which are deposited base layers 20, consisting of dielectric film, that are designed to carry, as a further layer, a phosphor unit in the form of a film 6. In a further manufacturing stage, both the dielectric base 20 and the phosphor film 6 are provided with a covering layer 22 also consisting of a dielectric film. The two dielectric-film layers 20 and 22 thus constitute a cell 24 in which the phosphor film 6 is totally encapsulated, while each cell is isolated from adjacent cells. The typical size of these cells may vary between 1 and 2 mm. The cells 24 are embedded in a sealing polymer 26 on which is applied a transparent electrode 8 made for example of ITO. The transparent electrode is protected by a further layer 28 consisting of a transparent polymer.

The phosphor-containing cells 24 being isolated from one another as well as having relatively small dimensions, it will be appreciated that, in contradistinction to the prior-art EL-elements which had to be manufactured to size and factory-sealed, the EL-elements according to the invention can be cut to size from rolls, stamped, punched, riveted, etc., without endangering the integrity and full service life of the element, as such operations will expose to the damaging effect of moisture only those cells, negligible in number as well as in area extent, that happen to lie in the path of the cutting, punching, etc., tool. Because of the small size of the cells 24 it is also possible to bend the elements at radii as small as a few cm.

The processes by means of which the various layers of these thin-layer elements can be applied are well-known, mainly from the manufacture of solid-state devices, and may include evaporation, sputtering, chemical vapor deposition (CVD), and others.

The rest of the embodiments according to the present invention are all thick-layer devices and will be discussed in the following.

Thick-layer EL-elements which term, in the present context, refers to EL-elements the phosphors of which are in the form of distinct grains rather than a uniform film, can be produced by two methods: (a) the printing method, and (b) the grid method.

Figure 4:
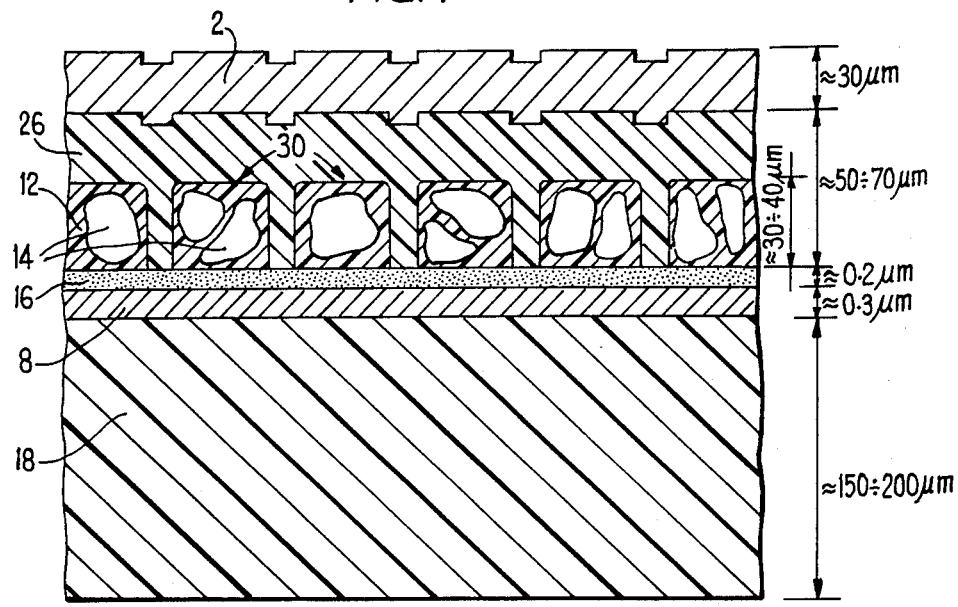
FIG. 4 is a similar view of a first embodiment of a thick-layer EL-element.

FIG. 4 is a schematic cross-section of an EL-element produced by printing. The various layers are built up starting from the side of the aluminum foil 2 that serves as back electrode, on which are printed the low water-permeability sealing polymer 26, then the cells 30 containing the phosphor grains 14 embedded in a low-leakage-current high dielectric constant binder 12, then a binder 16 and the transparent ITO electrode 8. To this structure is finally applied a lowpermeability polymer film 18. Alternatively, the layers can also be built up starting from the polymer film 18. The ribbing on the surface of the aluminum foil 2 (which is reproduced also in the sealing-polymer layer 26) is due to the fact that, during the printing process, the foil 2 is supported by a relatively soft rubber back-up layer which slightly yields at the points of highest printing pressure.

It is seen that in the EL-elements produced by the printing method, the cells 30 are separated from each other by the introduction, between them, of layers of sealing polymer 26.

Figure 5:
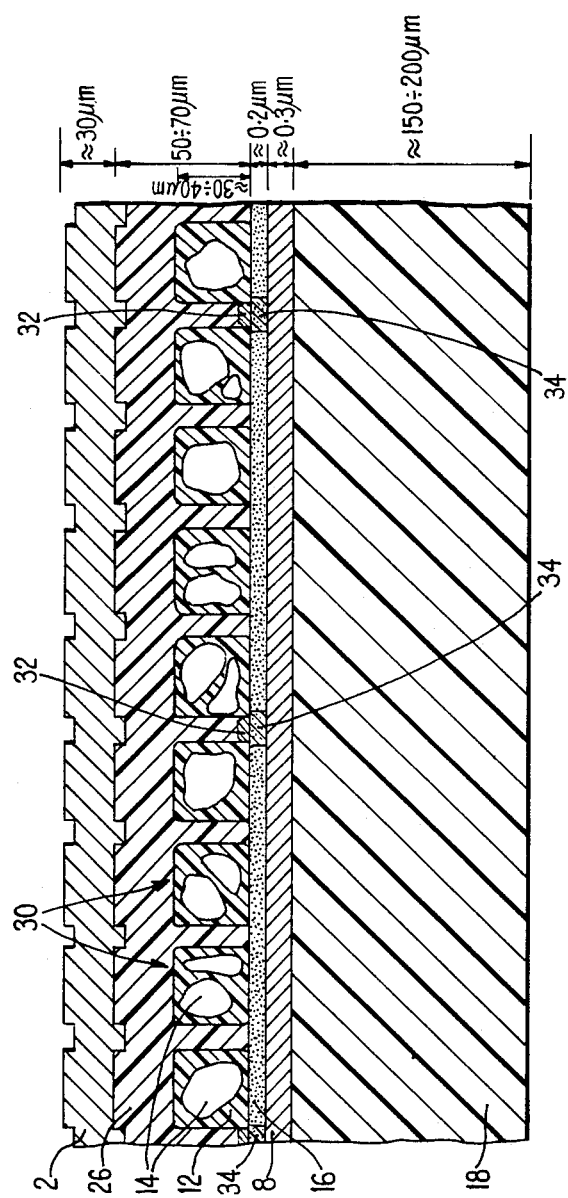
FIG. 5 illustrates a variant of the embodiment of FIG. 4.

A variant of the element of FIG. 4 is shown in FIG. 5. In order to simplify electrical connection to the transparent electrode 8, a thin metallic contact grid 32 is introduced between the sealing polymer 26 filling the interstices between groups of cells 30, connection between the grid 32 and the transparent electrode 8 is effected by a locally disposed conductive epoxy binder 34.

Figure 6:
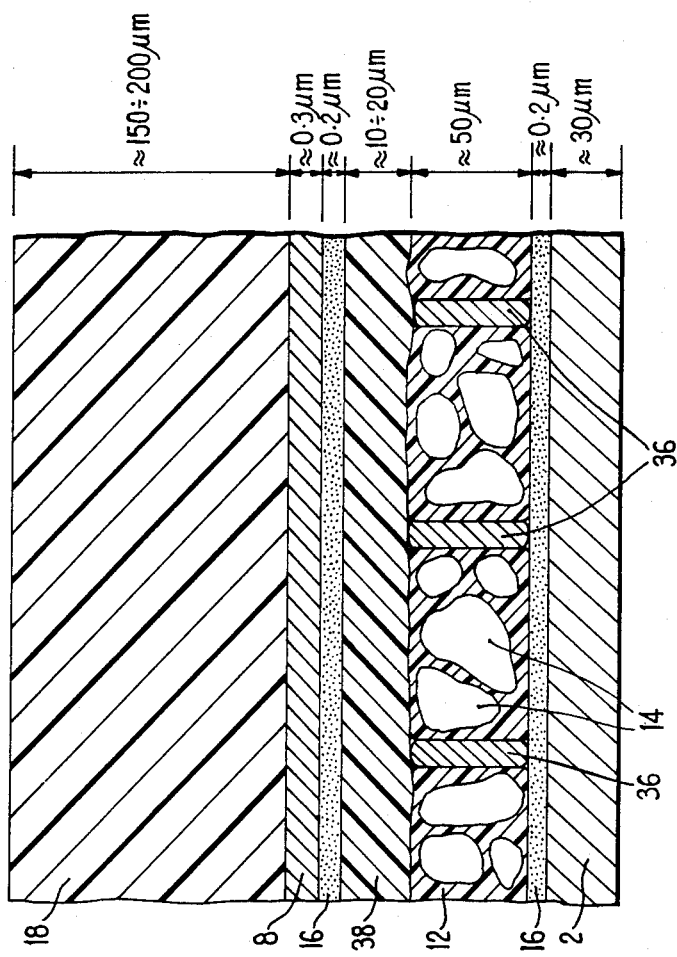
FIG. 6 shows a further embodiment using the grid method.

The grid method is illustrated in the schematic cross-sectional view of FIG. 6. With this method, the cells 30 are separated from each other by the elements of a grid-like structure 36 which can be made either of a polymer or a metal.

One way to produce a polymer grid is to provide a polymer film with rows of short slits, the slits in successive rows being laterally offset with respect to each other by half the "pitch" of the rows. The film is then clamped at its edges and subjected to a shrinking process, as a result of which the slits will open and produce an effect similar to that of the well-known "expanded metal" grid.

Another way to produce a polymer grid is to take a woven net made of monofilar polymer fibers and treat it by hot pressing, until the "warp" and "weft" fibers become flat and co-planar.

Metal grids, on the other hand, are made by the well-known photolithographic process and, prior to their application, are electrically insulated by dipping in an insulating polymer.

The grid 36, whether polymer or metal, is seen in FIG. 6 to be filled with phosphor grains 14 which are embedded in a low-leakage-current, high-dielectric coefficient polymer 12, which also has a low water-vapor permeability factor. At its underside the phosphor-filled grid 36 is bonded to the aluminum electrode 2 by means of the binder layer 16, while at its upper side it is hermetically sealed off by a layer of transparent, highly water-vapor impervious polymer 38 which, in its turn, is bonded to the thin ITO electrode deposited on the plastic substrate 18 via the transparent binder 16.

In this embodiment, too, it is possible to introduce the contact grid 32 mentioned in conjunction with FIG. 5, in which case a conductive binder 34 must be used, as was done in the embodiment of FIG. 5.

Figure 7:
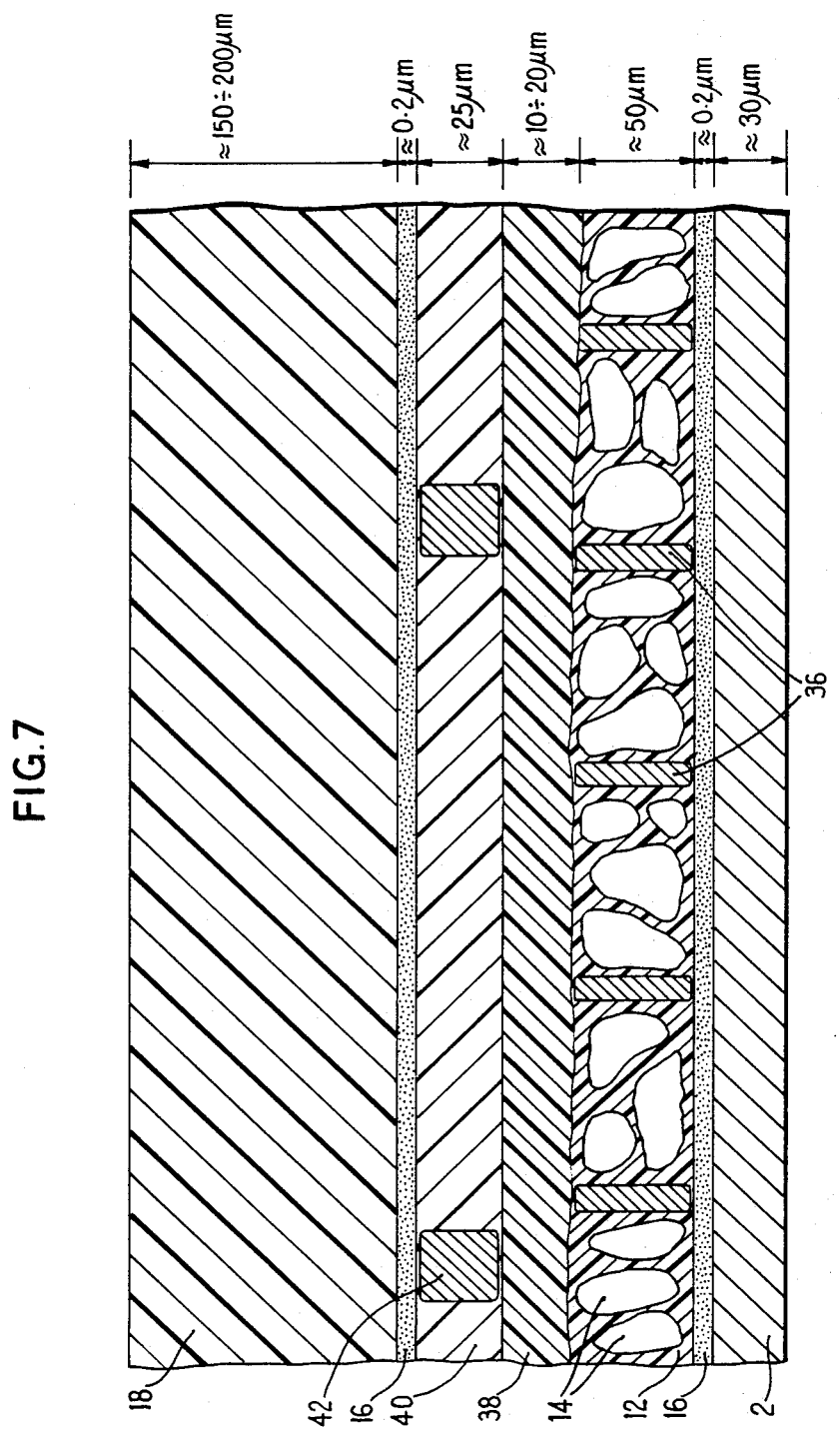
FIG. 7 is a variant of the embodiment of FIG. 6 in which the ITO layer has been replaced by a conductive polymer.

FIG. 7 shows a further embodiment, in which the ITO layer has been dispensed with. While right up to, and including, the previous polymer layer 38, the structure of this embodiment equals that of FIG. 6, the ITO layer has been replaced by layer of transparent and conductive polymer 40 which is both less expensive and easier to apply than the ITO layer. To improve the average spatial conductivity of this polymer, and also for electrical contact accessibility, there is included in this layer a metal grid 42 the open spaces of which are much larger than the open spaces of the grid 36. The whole structure is mounted on a plastic substrate 18 with the aid of the transparent binder 16.

The contact grid 42 and the conductive polymer 40 could also be directly applied to the substrate 18 by printing.

Figure 8:
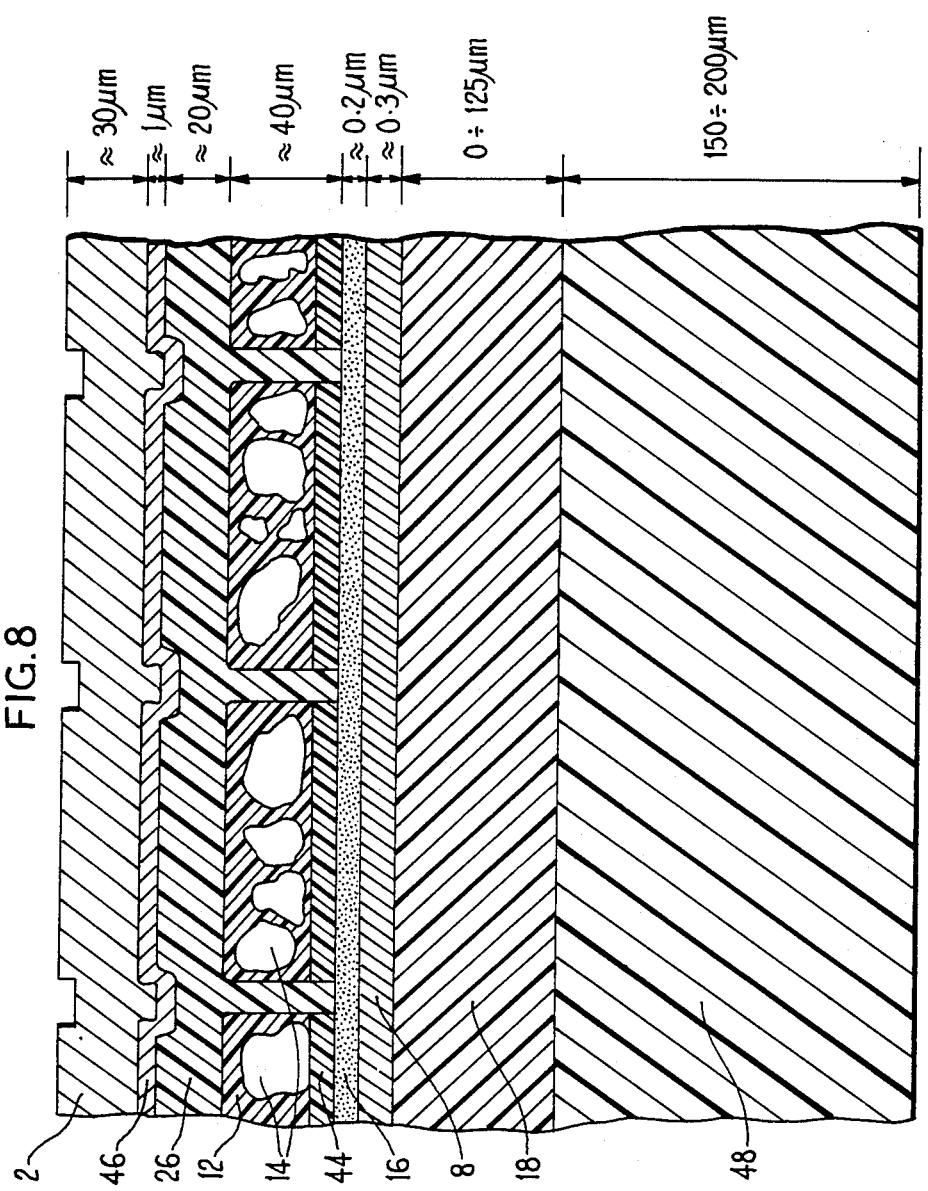
FIG. 8 is an elaboration of the embodiment of FIG. 4.

FIG. 8 illustrates another, more elaborate, version of the embodiment of FIG. 4, which has three additional layers, the most important of which is a desiccant layer 44 consisting of such materials as a water-absorbing polymer (nylon or polyvinyl acetate) or a mixture of water-absorbing mineral and a polymer. The task of this layer is to absorb remnants of water vapor from the manufacturing process that might be left in the cell structure of the light source, as well as to absorb water vapor that might penetrate through the transparent external polymer layers, thus preventing the vapor from reaching the phosphor grains 14. Addition of such a layer has shown to extend the service life of the source by about 50%. The sealing polymer 26 that separates the cells 30 in which are embedded the grains 14 is also effective between the desiccant units and prevents advance of moisture along the absorbent layer between the distinct cells 30.

To improve source brightness which is liable to decrease due to the presence, in the electric field, of the desiccant layer, ITO powder, a conductive, transparent material, may be added to the desiccant polymer, acting on the phosphor.

Alternatively, a layer, about 1 μm thick, of a conductive, transparent material based on ITO is applied to the desiccant layer 44 so as to be interposed between the latter and the phosphor-grain containing cells. The effect of this conductive, transparent film is similar to that of the addition of ITO to the desiccant, producing a rise in source brightness.

Another added layer is a primer 46, to which has been added a material having a high dielecric coefficient, as well as high reflectance in the region of visible light.

A further improvement is constituted by the outermost layer 48 which consists of a polymer transparent to visible light, but opaque to UV-radiation.

The above-described added layers are suitable for all thick-layer elements, both of the printed and the grid versions.

While the geometry of the cells 30, as seen in plan view, is optional, the most efficient use of a given EL-element area would be obtained by a hexagonal configuration.

It will be evident to those skilled in the art that the invention is not limited to the details of the foregoing illustrative embodiments and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A continuous, foil-like electroluminescent lighting element comprising:
    a plurality of separate units, each constituted of one or more discrete pieces of a phosphor, each unit being fully encapsulated in a cell consisting of a dielectric, which cell is at least partly embedded in a sealing substance, and
    two electrodes of which at least one is at least partly light-transmissive, between which electrodes are disposed said dielectric cells containing said encapsulated phosphor units, and said sealing substance, wherein each of said phosphor-containing cells is substantially isolated from adjacent cells by a separating means whereby moisture is prevented from propagating beyond any damaged cell or cells.

2. The lighting element as claimed in claim 1, further comprising an outer, light-transmissive polymer coating for said light-transmissive electrode.

3. The lighting elements as claimed in claim 1, wherein said sealing substance is a polymer of low water-vapor permeability.

4. The lighting elements as claimed in claim 1, wherein said discrete piece of a phosphor is in the form of a depositable film.

5. The lighting element as claimed in claim 1, wherein said discrete piece of a phosphor is in the form of at least one phosphor grain.

6. The lighting element as claimed in claim 1, further comprising a metal grid accessible from the outside of said element for electrical connection and disposed in electric contact with said light-transmissive electrode.

7. The lighting elements as claimed in claim 1, wherein said cells are laterally confined in the interstices of a grid-like structure.

8. The lighting element as claimed in claim 1, wherein said transparent electrode consists of indium-tin oxides.

9. The lighting element as claimed in claim 1, wherein said light-transmissive electrode consists of an electrically conductive polymer.

10. The lighting element as claimed in claim 1, further comprising a desiccant layer interposed between said cells and said at least partly light-transmissive electrode.

11. The lighting elements as claimed in claim 1, further comprising a primer layer interposed between the non-light-transmissive one of said electrodes and having a high dielectric constant as well as high reflectance of visible light.

12. The lighting element as claimed in claim 1, furthermore comprising an outermost layer consisting of a polymer transparent to visible light, but opaque to UV-radiation.

* * * * *